(12) United States Patent
Lee

(10) Patent No.: US 9,780,325 B2
(45) Date of Patent: Oct. 3, 2017

(54) ORGANIC LIGHT EMITTING DISPLAY DEVICE

(71) Applicant: LG DISPLAY CO., LTD., Seoul (KR)

(72) Inventor: Se Hee Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/560,537

(22) Filed: Dec. 4, 2014

(65) Prior Publication Data

US 2015/0194471 A1   Jul. 9, 2015

(30) Foreign Application Priority Data

Dec. 31, 2013 (KR) .................. 10-2013-0169320

(51) Int. Cl.
| | |
|---|---|
| *H01L 27/32* | (2006.01) |
| *H01L 51/52* | (2006.01) |
| *H01L 51/50* | (2006.01) |
| *H01L 51/56* | (2006.01) |
| *H01L 51/00* | (2006.01) |

(52) U.S. Cl.
CPC ...... *H01L 51/5218* (2013.01); *H01L 27/3211* (2013.01); *H01L 51/5265* (2013.01); *H01L 51/5278* (2013.01); *H01L 51/0059* (2013.01); *H01L 51/0081* (2013.01); *H01L 51/0085* (2013.01); *H01L 2251/308* (2013.01); *H01L 2251/5315* (2013.01)

(58) Field of Classification Search
CPC ............ H01L 51/5218; H01L 51/5265; H01L 51/5278; H01L 27/3211
USPC .............................................. 257/40; 438/82
See application file for complete search history.

(56) References Cited

U.S. PATENT DOCUMENTS

| | | | |
|---|---|---|---|
| 8,026,662 B2 | 9/2011 | Ishihara et al. | |
| 2005/0095514 A1* | 5/2005 | Lee ................. | G02B 5/201 430/7 |
| 2005/0196893 A1* | 9/2005 | Kim ................. | H01L 27/3211 438/82 |
| 2005/0221121 A1* | 10/2005 | Ishihara .......... | H01L 51/5036 428/690 |
| 2007/0160870 A1* | 7/2007 | Yu .................. | H01L 51/006 428/690 |
| 2008/0171226 A1* | 7/2008 | Noh ................ | H01L 51/5044 428/690 |
| 2011/0062475 A1* | 3/2011 | Cho ................ | H01L 51/5036 257/98 |

(Continued)

*Primary Examiner* — Sue A Purvis
*Assistant Examiner* — Thai T Vuong
(74) *Attorney, Agent, or Firm* — Dentons US LLP

(57) ABSTRACT

Disclosed is an organic light emitting display device having excellent lifespan and current efficiency characteristics, as well as high luminance to provide increased resolution and improved reliability, and a method for manufacturing the same. The organic light emitting display device comprises a substrate having first, second, and third pixel regions; a first electrode arranged on the substrate; a second electrode arranged on the first electrode; and an organic layer arranged between the first electrode and the second electrode. The organic layer includes first, second and third organic layers on the first, second and third pixel regions, respectively. Each of the first, second and third organic layers includes a plurality unit organic layers and at least one charge generating layer arranged between the plurality of unit organic layers.

12 Claims, 4 Drawing Sheets

(56) References Cited

U.S. PATENT DOCUMENTS

| | | | |
|---|---|---|---|
| 2011/0133227 A1* | 6/2011 | Lee | H01L 51/5036 257/89 |
| 2013/0092909 A1* | 4/2013 | Han | H01L 51/5004 257/40 |
| 2013/0264551 A1 | 10/2013 | Pieh et al. | |
| 2013/0285035 A1* | 10/2013 | Taka | C09K 11/06 257/40 |
| 2014/0061598 A1* | 3/2014 | Kim | H01L 51/5253 257/40 |

* cited by examiner

ORGANIC LIGHT EMITTING DISPLAY DEVICE

CROSS REFERENCE TO RELATED APPLICATIONS

This application claims the benefit of the Korean Patent Application No. 10-2013-0169320 filed on Dec. 31, 2013 which is hereby incorporated by reference for all purposes as if fully set forth herein.

BACKGROUND OF THE INVENTION

Field of the Invention

The present invention relates to an organic light emitting display device and a method for manufacturing the same.

Discussion of the Related Art

An organic light emitting display device is a newer type of flat panel display device which is a self light-emitting device, and has a viewing angle and contrast ratio that are better than those of a liquid crystal display (LCD) device. The organic light emitting display device is lightweight and thin because it does not need a separate back light, and has reduced power consumption. Also, the organic light emitting display device may be driven at a direct current and low voltage, has fast response speed, and especially has an advantage of lower cost with respect to manufacturing costs.

The organic light emitting display device injects electrons and holes into a light emitting layer from a cathode for electron injection and an anode for hole injection, respectively, and emits light when exciton obtained by combination of the injected electrons and holes is transited from an excited state to a ground state. At this time, the organic light emitting display device may be divided into a top emission type, a bottom emission type, and a dual emission type depending on a direction to which light is emitted, and may be divided into a passive matrix type and an active matrix type depending on a driving mode.

In case of the active matrix type, the organic light emitting display device displays an image by selectively emitting light through a selected sub pixel if a scan signal, a data signal and a power source are individually supplied to a plurality of sub pixels which are arranged in a matrix arrangement. At this time, the sub pixel includes a thin film transistor, which includes a switching thin film transistor, a driving thin film transistor and a capacitor, and an organic light emitting display device, which includes a first electrode connected to the driving thin film transistor, an organic layer and a second electrode.

Recently, a display device of high resolution product group has been requested. To realize such a display device, the number of pixels per unit area should be increased, and luminance should be more improved. However, there is limitation in current efficiency characteristic due to limitation in a structure of the organic light emitting display device, and electric and thermal stress within the device is increased in accordance with increase of current, whereby reliability is reduced.

Accordingly, studies of a method for solving structural limitation of the organic light emitting display device to realize a product of high resolution and a method for improving problems of power consumption increase, lifespan reduction, and reliability reduction have been made.

SUMMARY OF THE INVENTION

Accordingly, the present invention is directed to an organic light emitting display device and a method for manufacturing the same, which substantially obviate one or more problems due to limitations and disadvantages of the related art.

An advantage of the present invention is to provide an organic light emitting display device, which has excellent lifespan and current efficiency characteristics as well as high luminance characteristic to realize a product of high resolution and has improved reliability, and a method for manufacturing the same.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device comprises a substrate in which a first pixel region, a second pixel region and a third pixel region are defined; a first electrode arranged on the substrate; a second electrode arranged on the first electrode; and an organic layer arranged between the first electrode and the second electrode, wherein the organic layer includes a plurality of unit organic layers of a deposition structure per the first, second and third pixel regions and a charge generating layer, the charge generating layer is arranged between the plurality of unit organic layers, the plurality of unit organic layers include a plurality of first light emitting layers, a plurality of second light emitting layers and a plurality of third light emitting layers per the first, second and third pixel regions, and at least one of the plurality of first light emitting layers has a thickness is different from those of the plurality of second and third light emitting layers.

In another aspect of the present invention, a method for manufacturing an organic light emitting display device comprises the steps of forming a first electrode on a substrate in which a first pixel region, a second pixel region and a third pixel region are defined; forming a hole transporting layer on the first electrode; forming a first light emitting layer, a second light emitting layer and a third light emitting layer on the hole transporting layer to respectively correspond to the first, second and third pixel regions; forming an electron transporting layer on the first, second and third light emitting layers; forming an N-charge generating layer on the electron transporting layer; forming a hole transporting layer on the charge generating layer; forming a first light emitting layer, a second light emitting layer and a third light emitting layer on the hole transporting layer to respectively correspond to the first, second and third pixel regions; forming an electron transporting layer on the first, second and third light emitting layers; and forming a second electrode on the electron transporting layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts. Although different reference numbers for the same terminology will be used throughout the drawings, the different reference numbers mean the same elements.

In the following description, if detailed description of disclosure or elements known in respect of the present invention is determined to be make the subject matter of the present invention unnecessarily obscure, the detailed description will be omitted.

The terminology "on" disclosed in this specification means that some element is formed on another element and a third element is interposed between these elements.

The terminologies such as "first" and "second" disclosed in this specification do not mean the order of corresponding elements and are intended to identify the corresponding elements from each other.

Figure 1:
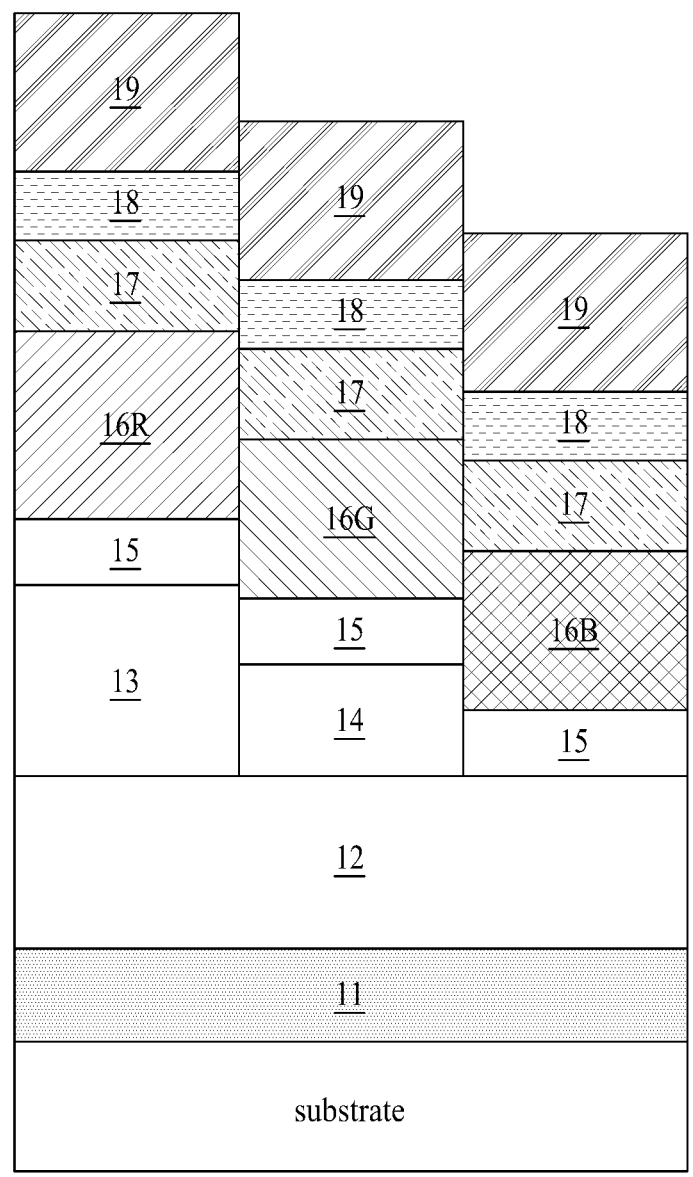
FIG. 1 is a cross-sectional view briefly illustrating a general organic light emitting display device.

FIG. 1 is a cross-sectional view briefly illustrating a general organic light emitting display device.

As shown in FIG. 1, an organic light emitting display device 10 includes a first electrode 11 on a substrate, a second electrode 18, a capping layer 19, and an organic layer formed between the first electrode 11 and the second electrode 18. At this time, the organic layer includes first to third hole transporting layers 12, 13 and 14, an electron stopper layer 15, light emitting layers 16R, 16G and 16B, and an electron transporting layer 17.

To manufacture the organic light emitting display device 10, a driving thin film transistor is formed in each of pixel regions on the substrate in which a display region having a plurality of pixel regions is defined, and a passivation layer is formed on the driving thin film transistor. Also, the first electrode 11, which is connected with a drain electrode of the driving thin film transistor exposed by a contact hole formed in the passivation layer, is formed, the organic layer, which includes the light emitting layers 16R, 16G and 16B of a single layered structure, is formed on the first electrode, and the second electrode 18 is formed on the organic layer.

As described above, it is general that the light emitting layers of the organic light emitting display device 10 are formed in a single layered structure.

In an organic light emitting display device 100 according to one embodiment of the present invention, gate and data lines, which define first, second and third pixel regions Rp, Gp and Bp by crossing each other on a substrate (not shown), and a power line extended in parallel with any one of the gate and data lines are arranged. A switching thin film transistor connected with the gate line and the data line and a driving thin film transistor connected with the switching thin film transistor are arranged in the first, second and third pixel regions Rp, Gp and Bp. The driving thin film transistor is connected with a first electrode 110. The first electrode 110 is a reflective material, and a second electrode 160 facing the first electrode 110 is a semi-transmissible material.

Figure 2:
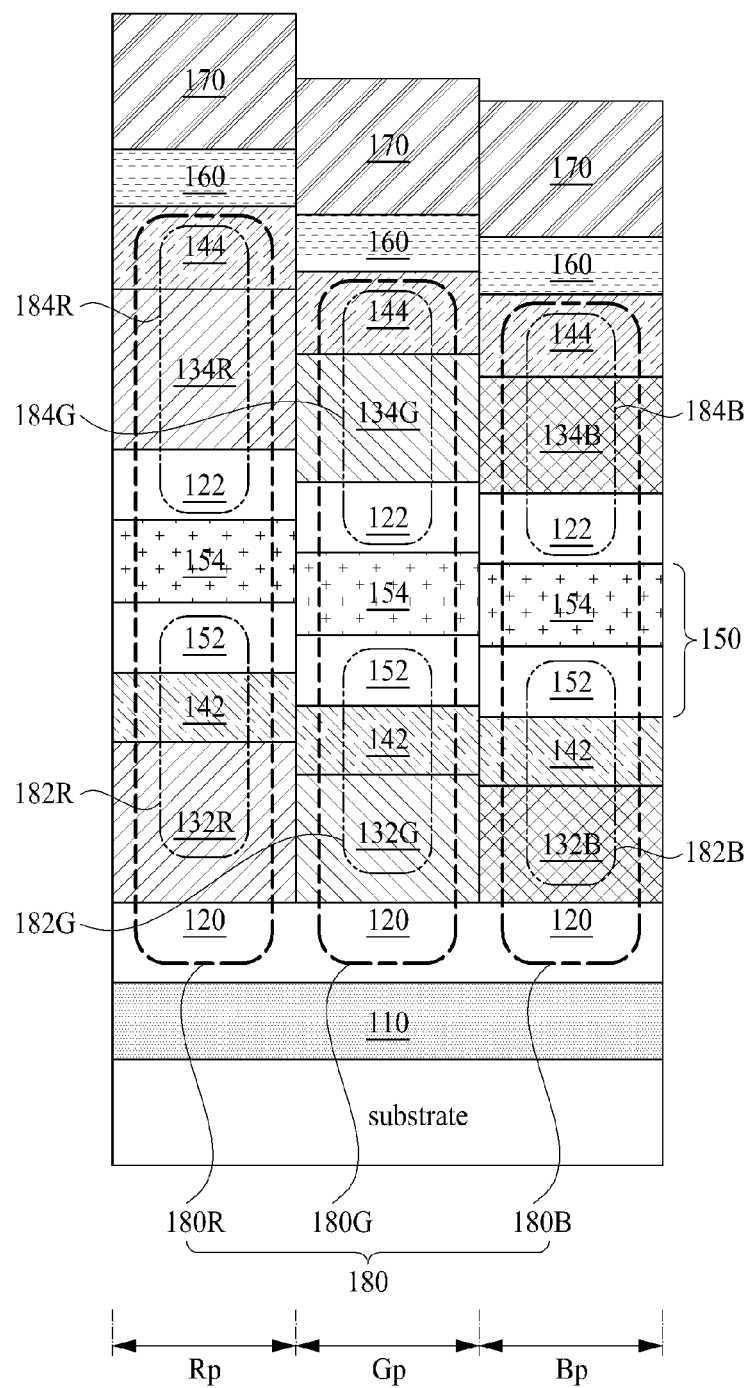
FIG. 2 is a cross-sectional view briefly illustrating an organic light emitting display device according to one embodiment of the present invention.

As shown in FIG. 2, in one embodiment of the present invention, the organic light emitting display device 100 includes the first electrode 110 arranged on a substrate in which the first pixel region Rp, the second pixel region Gp and the third pixel region Bp are defined, a second electrode 160 arranged on the first electrode 110, an organic layer 180 arranged between the first electrode 110 and the second electrode 160, and a capping layer 170 arranged on the second electrode 160.

As shown in FIG. 2, the organic layer 180 includes a first organic layer 180R, a second organic layer 180G, and a third organic layer 180B, which are arranged to respectively correspond to the first, second and third pixel regions Rp, Gp and Bp. The first organic layer 180R includes a plurality of first unit organic layers 182R and 184R, the second organic layer 180G includes a plurality of second unit organic layers 182G and 184G, and the third organic layer 180B includes a plurality of third unit organic layers 182B and 184B. The first unit organic layer 184R is arranged on the first unit organic layer 182R, and a charge generating layer 150 is arranged between the first unit layers 182R and 184R. The second unit organic layer 184G is arranged on the second unit organic layer 182G, and the charge generating layer 150 is arranged between the second unit layers 182G and 184G.

The third unit organic layer 184B is arranged on the third unit organic layer 182B, and the charge generating layer 150 is arranged between the third unit layers 182B and 184B. In other words, the organic layer 180 includes the first, second and third unit organic layers 182R, 182G and 182B and the first, second and third unit organic layers 184R, 184G and 184B, and the charge generating layer 150 arranged between the respective unit organic layers.

In other words, the first, second and third unit organic layers 182R, 182G and 182B and the first, second and third unit organic layers 184R, 184G and 184B are sequentially deposited by interposing the charge generating layer 150 therebetween.

At this time, it will be apparent that one charge generating layer is arranged between the two unit organic layers if the first, second and third unit organic layers are two layers as shown in FIG. 2, and two charge generating layers are arranged among the three unit organic layers if the first, second and third unit organic layers are three organic layers.

The first unit organic layer 182R includes a hole transporting layer 120, a first light emitting layer 132R and an electron transporting layer 142. The second unit organic layer 182G includes a hole transporting layer 120, a second light emitting layer 132G and an electron transporting layer 142. The third unit organic layer 182B includes a hole transporting layer 120, a third light emitting layer 132B and an electron transporting layer 142. The first unit organic layer 184R includes a hole transporting layer 122, a first light emitting layer 134R and an electron transporting layer 144. The second unit organic layer 184G includes a hole transporting layer 122, a second light emitting layer 134G and an electron transporting layer 144. The third unit organic layer 184B includes a hole transporting layer 122, a third light emitting layer 134B and an electron transporting layer 144.

In other words, the first, second and third unit organic layers 182R, 182G and 182B include a hole transporting layer 120, first, second and third light emitting layers 132R, 132G and 132B, and an electron transporting layer 142, and the first, second and third unit organic layers 184R, 184G and 184B include a hole transporting layer 122, first, second and third light emitting layers 134R, 134G and 134B, and an electron transporting layer 144.

At this time, the first, second and third light emitting layers 132R, 132G and 132B are arranged on the hole transporting layer 120, and the first, second and third light emitting layers 134R, 134G and 134B are arranged on the hole transporting layer 122.

Meanwhile, one charge generating layer 150 includes an N-charge generating layer 152 doped with an N-type dopant and a P-charge generating layer 154 doped with a P-type dopant, wherein the N-charge generating layer 152 and the P-charge generating layer 154 have a deposition structure.

In accordance with Micro Cavity effect, any one of the first, second and third organic layers 180R, 180G and 180B of the first, second and third pixel regions Rp, Gp and Bp may emit light of red, another one of the other organic layers may emit light of green, and the other one may emit light of blue.

At this time, the organic layer 180R of the first pixel region Rp may emit light of red, the organic layer 180G of the second pixel region Gp may emit light of green, and the organic layer 180B of the third pixel region Bp may emit light of blue. In this case, a thickness of the organic layer 180R of the first pixel region Rp may be thicker than those of the organic layers 180G and 180B of the second and third pixel regions Gp, and a thickness of the organic layer 180G of the second pixel region Gp may be thicker than that of the organic layer 180B of the third pixel region Bp.

At this time, the thicknesses of the first, second and third organic layers 180R, 180G and 180B may be adjusted by the first, second and third unit organic layers 182R, 182G, 182B, 184R, 184G and 184B included in the first, second and third organic layers 180R, 180G and 180B, wherein a thickness of at least one of the first unit organic layers 182R and 184R may be thicker than those of the second and third unit organic layers 182G, 182B, 184G and 184B, and a thickness of at least one of the second unit organic layers 182G and 184G may be thicker than those of the third unit organic layers 182B and 184B.

At this time, the thicknesses of the first, second and third organic layers 180R, 180G and 180B may be adjusted by the first, second and third light emitting layers 132R, 132G, 132B, 134R, 134G and 134B included in the first, second and third unit layers 182R, 182G, 182B, 184R, 184G and 184B, wherein a thickness of at least one of the first light emitting layers 132R and 134R may be thicker than those of the second and third light emitting layers 132G, 132B, 132G and 132B, and a thickness of at least one of the second light emitting layers 132G and 132B may be thicker than those of the third light emitting layers 132B and 134B.

At this time, a mixed material of a material having high hole mobility, such as arylamine derivative, which includes NPD or triamine derivative, and a conventional host material may be used as a host included in the first, second and third light emitting layers 132R, 132G, 132B, 134R, 134G and 134B. For example, a mixture obtained by mixing Be Complex derivative and NPD at a ratio of 1:1 or a mixture obtained by mixing Be Complex derivative and triamine derivative at a ratio of 1:1 may be used as the host of the first light emitting layers 132R and 134R.

Although FIG. 2 illustrates that a plurality of layers of first, second and third unit organic layers are deposited, for convenience, illustrates that two layers of first, second and third unit organic layers are deposited, the spirit of the present invention is not limited to FIG. 2, and, for example, three layers, four layers or more of the first, second and third unit organic layers may be deposited.

As described above, the organic light emitting display device 100 according to one embodiment of the present invention may include a plurality of first, second and third unit organic layers arranged to respectively correspond to the first, second and third pixel regions Rp, Gp and Bp, in a deposited structure. At this time, the thickness of the organic layer 180R of the pixel region Rp emitting light of red may be thicker than those of the organic layers 180G and 180B of the pixel regions Gp and Bp emitting light of different colors. At this time, the host included in at least one of the first, second and third light emitting layers 132R, 132G, 132B, 134R, 134G and 134B may include at least two materials, wherein the at least two materials may include arylamine derivative such as NPD or triamine derivative, which has high hole mobility.

As a result, a plurality of the first, second and third light emitting layers 132R, 132G, 132B, 134R, 134G and 134B are formed at each of the first, second and third pixel regions Rp, Gp and Bp, whereby lifespan and current efficiency characteristics may be improved, and reliability may be improved.

Also, the host included in the first, second and third light emitting layers 132R, 132G, 132B, 134R, 134G and 134B includes a material having high hole mobility, whereby a driving voltage increase width caused as the thicknesses of the first, second and third organic layers 180R, 180G and 180B become thick may be reduced.

Accordingly, structural limitation of the general organic light emitting display device may be solved and high resolution may be realized.

Particularly, light emitting efficiency of the organic light emitting display device 100 according to one embodiment of the present invention is determined by Micro Cavity effect, a reflectivity of the first electrode and transmittance of the second electrode. To this end, a total thickness of each of the first, second and third organic layers 180R, 180G and 180B arranged to respectively correspond to the first, second and third pixel regions Rp, Gp and Bp of the organic light emitting display device 100 according to one embodiment of the present invention should satisfy a unique optical distance condition that may generate constructive interference of a specific wavelength range. The thickness of each of the first, second and third organic layers 180R, 180G and 180B should be designed considering the unique optical distance condition.

In other words, the first, second and third organic layers 180R, 180G and 180B should be formed with thicknesses to satisfy the optical distance condition in such a manner that any one of the first, second and third organic layers 180R, 180G and 180B may generate constructive interference for a red wavelength, another one of the other two organic layers may generate constructive interference for a green wavelength, and the other one may generate constructive interference for a blue wavelength.

Hereinafter, each element of the organic light emitting display device 100 according to one embodiment of the present invention will be described in more detail. However, it is to be understood that the following embodiment is only exemplary and the present invention is not limited to the following embodiment.

First of all, a substrate has a plurality of pixel regions divided by a gate line (not shown) and a data line (not shown), and a driving thin film transistor is formed at each of the plurality of pixel regions.

In this case, the substrate may be a transparent glass material, or may be a plastic or high polymer film, which has excellent flexibility to realize a flexible display. Although not shown, the substrate may further include a buffer layer (not shown) such as SiO2 and SiNx to protect a driving element formed from impurities, such as alkali ion which leaks out, during a following process.

Next, the thin film transistor includes a driving thin film transistor and a switching thin film transistor. In addition, compensation circuits, which are intended to compensate a threshold voltage of the driving thin film transistor, that is, a plurality of capacitors may additionally be formed. The plurality of capacitors may be arranged freely. At this time, the driving thin film transistor is connected to the switching thin film transistor, and may control a voltage applied to the first electrode 110 connected with a drain electrode of the driving thin film transistor in accordance with on or off of the driving thin film transistor controlled by the switching thin film transistor.

Next, the first electrode 110 is an anode electrode, and is independently formed at the first, second and third pixel regions Rp, Gp and Bp on a passivation layer (not shown) and then connected with the drain electrode of the driving thin film transistor.

At this time, since the first electrode 110 should act as a work electrode of electrodes provided in the organic light emitting display device 100, the first electrode 110 may be formed of a conductive material. The first electrode 110 may be a reflective electrode of multi-layer formed of ITO, IGZO, IZO, IZTO, ZnO, ZTO, FTO, FZO AZO, ATO, GZO or $In_2O_3$ on a reflective film after the reflective film is formed of Ag, Mg, Al, Pt, Pd, Au, Ni, Nd, Ir, Cr and their compound. For example, the first electrode 110 may be a multi-layer formed of a compound of 500 Å to 2000 Å, which contains Ag of 90% or more, and ITO of 50 Å to 200 Å.

Meanwhile, the second electrode 160 is arranged on the first electrode 110, and may be formed on an entire surface of the substrate. The second electrode 160 may be formed in a dual layered structure. In this case, any one dual layered structure selected from single/single, single/mixture, mixture/single, and mixture/mixture may be formed of a metal material or an inorganic material.

At this time, the second electrode 160 may include Ag, Mg, Yb, Li, Ca, etc. as a metal, and may include $Li_2O$, CaO, LiF, and $MgF_2$ as an inorganic material. The second electrode 160 may be formed at a ratio of 1:1~1:10 in case of a mixed layer of metal:inorganic material or metal:metal.

Next, the organic layer 180 is arranged between the first electrode 110 and the second electrode 160. The organic layer 180 includes the first organic layer 180R, the second organic layer 180G and the third organic layer 180B, which are arranged to respectively correspond to the first, second and third pixel regions Rp, Gp and Bp. The first organic layer 180R includes a plurality of first unit organic layers 182R and 184R, the second organic layer 180G includes a plurality of second unit organic layers 182G and 184G, and the third organic layer 180B includes a plurality of third unit organic layers 182B and 184B. The first unit organic layer 184R is arranged on the first unit organic layer 182R, and the charge generating layer 150 is arranged between the first unit organic layers 182R and 184R. The second unit organic layer 184G is arranged on the second unit organic layer 182G, and the charge generating layer 150 is arranged between the second unit organic layers 182G and 184G. The third unit organic layer 184B is arranged on the third unit organic layer 182B, and the charge generating layer 150 is arranged between the third unit organic layers 182B and 184B.

In other words, the organic layer 180 includes the first, second and third unit organic layers 182R, 182G and 182B and the first, second and third unit organic layers 184R, 184G and 184B, and includes the charge generating layer 150 arranged between the respective unit organic layers. In other words, the first, second and third unit organic layers 182R, 182G and 182B and the first, second and third unit organic layers 184R, 184G and 184B are sequentially deposited by interposing the charge generating layer 150 therebetween. Such an organic layer 180 may be formed to have a total thickness of 1500 Å to 3000 Å.

The first unit organic layer 182R includes a hole transporting layer 120, a first light emitting layer 132R emitting light of any one of red, green and blue, and an electron transporting layer 142, to enhance light emitting efficiency. Likewise, the second unit organic layer 182G includes a hole transporting layer 120, a second light emitting layer 132G, and an electron transporting layer 142, to enhance light emitting efficiency. Likewise, the third unit organic layer 182B includes a hole transporting layer 120, a third light emitting layer 132B, and an electron transporting layer 142, to enhance light emitting efficiency.

The first unit organic layer 182R includes a hole transporting layer 122, a first light emitting layer 134R emitting light of any one of red, green and blue, and an electron transporting layer 144, to enhance light emitting efficiency. Likewise, the second unit organic layer 184G includes a hole transporting layer 122, a second light emitting layer 134G emitting light of any one of red, green and blue, and an electron transporting layer 144, to enhance light emitting efficiency. Likewise, the third unit organic layer 184B includes a hole transporting layer 120, a third light emitting layer 134B emitting light of any one of red, green and blue, and an electron transporting layer 144, to enhance light emitting efficiency.

In other words, the first, second and third unit organic layers 182R, 182G and 182B include a hole transporting layer 120, first, second and third light emitting layers 132R, 132G and 132B, and an electron transporting layer 142, and the first, second and third unit organic layers 184R, 184G and 184B include a hole transporting layer 122, first, second and third light emitting layers 134R, 134G and 134B, and an electron transporting layer 144.

At this time, the first, second and third light emitting layers 132R, 132G and 132B are arranged on the hole transporting layer 120, and the first, second and third light emitting layers 134R, 134G and 134B are arranged on the hole transporting layer 122.

The hole transporting layer 120, 122 normally performs transportation and/or injection to the first, second and third light emitting layers 132R, 132G, 132B, 134R, 134G and 134B, and serves to enhance light emitting efficiency by restricting movement of electrons generated from the second electrode 160 to a portion other than a light emitting region.

At this time, the hole transporting layer 120, 122 may be at least one selected from NPD (N,N-dinaphthyl-N,N'-diphenyl benzidine), TPD (N,N'-bis-(3-methylphenyl)-N,N'-bis-(phenyl)-benzidine), TCTA (4-(9H-carbazol-9-yl)-N,N-bis[4-(9H-carbazol-9-yl)phenyl]-benzenamine), CBP (4,4'-N,N'-dicarbazole-biphenyl), s-TAD or MTDATA (4,4',4"-

Tris(N-3-methylphenyl-N-phenyl-amino)-triphenylamine), and the spirits of the present invention are not limited to the selected one.

The first, second and third light emitting layers 132R, 132G, 132B, 134R, 134G, and 134B includes a host and a dopant, and may be formed using a phosphor or fluorescent material emitting light of any one of red, green and blue.

The host included in the first, second and third light emitting layers 132R, 132G, 132B, 134R, 134G, and 134B includes a material having hole mobility of a value between $1.0 \times 10^{-5}$ (cm$^2$/Vs) and $1.0 \times 10^{-1}$ (cm$^2$/Vs).

For example, among the first, second and third organic layers 180R, 180G, and 180B, the organic layer designed to emit light of red in accordance with Micro cavity effect is designed to be thicker than the other organic layers. The host included in the first, second and third light emitting layers 132R, 132G, 132B, 134R, 134G, and 134B included in such an organic layer includes a material having hole mobility of a value between $1.0 \times 10^{-5}$ (cm$^2$/Vs) and $1.0 \times 10^{-1}$ (cm$^2$/Vs).

At this time, the host may include NPD ($1.4 \times 10^{-4}$ (cm$^2$/Vs)) which is a material having good hole mobility or a material of which hole mobility is $4.9 \times 10^{-4}$ (cm$^2$/Vs), or an arylamine derivative which contains a triamine derivative. However, the spirits of the present invention are not limited to the above materials, and a homogeneous material or a material having hole mobility equivalent to that of the above material may be used. For example, a mixture obtained by mixing Be Complex derivative and NPD at a ratio of 1:1 or a mixture obtained by mixing Be Complex derivative and triamine derivative at a ratio of 1:1 may be used as the host.

The first, second and third light emitting layers 132R, 132G, 132B, 134R, 134G, and 134B may be formed at thicknesses of 50 Å to 3000 Å.

In this case, if at least one of the first, second and third light emitting layers 132R, 132G, 132B, 134R, 134G, and 134B emits light of red, the light emitting layer emitting light of red may include a host that includes at least one selected from CBP (carbazole biphenyl), BCP, BeBq$_2$, CDBP, TAZ, BALq and mCP (1,3-bis(carbazol-9-yl).

At this time, the host may be doped with at least one phosphor material selected from PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), btp$_2$Ir(acac) and PtOEP (octaethylporphyrin platinum) as a dopant, or may be doped with at least one fluorescent material selected from PBD:Eu(DBM)$_3$(Phen) and Perylene as a dopant. However, kinds and combination of the host and the dopant are not limited to the above examples.

In this case, if at least one of the first, second and third light emitting layers 132R, 132G, 132B, 134R, 134G, and 134B emits light of green, the light emitting layer emitting light of green may include a host that includes at least one selected from CBP, BCP, BeBq$_2$, CDBP, TAZ, BALq and mCP.

At this time, the host may be doped with at least one phosphor material selected from ppy$_3$Ir(fac tris(2-phenylpyridine)iridium), ppy$_2$Ir(acac), dp$_2$Ir(acac), bzq$_2$Ir(acac), bo$_2$Ir(acac), op$_2$Ir(acac) and tpy$_2$Ir(acac) as a dopant, or may be doped with a fluorescent material of Alq$_3$(tris(8-hydroxyquinolino)aluminum) as a dopant. However, kinds and combination of the host and the dopant are not limited to the above examples.

In this case, if at least one of the first, second and third light emitting layers 132R, 132G, 132B, 134R, 134G, and 134B emits light of blue, the light emitting layer emitting light of blue may include a host that includes at least one selected from DNA/mADN/TBADN, UGH1, UG2, UGH3, UGH4, CBP, BCP, BeBq$_2$, CDBP, TAZ, BALq and mCP.

At this time, the host may be doped with at least one phosphor material selected from (4,6-F$_2$ppy)$_2$Irpic and L2BD111 as a dopant, or may be doped with at least one fluorescent material selected from spiro-DPVBi, spiro-6P, distil benzene (DSB), distrylarylene (DSA), DSA-amin, Perylene, PFO based high polymer and PPV based high polymer as a dopant. However, kinds and combination of the host and the dopant are not limited to the above examples.

The electron transporting layer 142, 144 serves to normally perform transportation and/or injection to the first, second and third light emitting layers 132R, 132G, 132B, 134R 134G, and 134B. An electron injection layer may separately be formed on the electron transporting layer 142, 144. The electron transporting layer 142, 144 may include at least one selected from PBD, BMB-3T, PF-6P, PyPySPyPy, COT, TPBI, sadiazole derivative, anthracene derivative, Alq$_3$(tris(8-hydroxyquinolino)aluminum), TAZ, BAlq and SAlq. However, the spirits of the present invention are not limited to the above example.

The charge generating layer 150 may be formed of a dual layer which is a P-N junction charge generating layer where junction of N-charge generating layer and P-charge generating layer is made. In other words, the charge generating layer 150 includes an N-charge generating layer 152 doped with N-type dopant and a P-charge generating layer 154 doped with P-type dopant, which have a deposition structure. At this time, the P-N junction charge generating layer generates charges or injects the charges into the first, second and third light emitting layers 132R, 132G, 132B, 134R, 134G, and 134B by separating holes from electrons.

In other words, the N-charge generating layer 152 supplies electrons to the first, second and third light emitting layers 132R, 132G, and 132B adjacent to the first electrode 110, and the P-charge generating layer 154 supplies holes to the first, second and third light emitting layers 134R, 134G, and 134B adjacent to the second electrode 160, whereby light emitting efficiency of the organic light emitting display device 100, which includes the plurality of first, second and third unit light emitting layers 182R, 182G, 182B, 184R, 184G, and 184B, may be more improved, and a driving voltage may be lowered.

In this case, the N-charge generating layer 152 may be formed of metal, or may be formed by doping N-type dopant on the host. At this time, if the N-charge generating layer 152 is formed of metal, the metal may be at least one selected from a group of Li, Na, K, Rb, Cs, Mg, Ca, Sr, Ba, La, Ce, Sm, Eu, Tb, Dy and Yb. At this time, if the N-charge generating layer 152 is formed by doping N-type dopant on the host, materials which are conventionally used may be used as the host and the N-type dopant.

In other words, the N-type dopant may be alkali metal, alkali metal compound, alkali earth metal, or alkali earth metal compound. In more detail, the N-type dopant may be at least one selected from a group of Cs, K, Rb, Mg, Na, Ca, Sr, Eu and Yb.

In other words, the host is an organic material and may be at least one selected from a group of Alq$_3$(tris(8-hydroxyquinolino)aluminum), Triazin, hydroxyquinoline derivative, benzazole derivative, and silole derivative.

Also, the P-charge generating layer 154 may be formed of metal, or may be formed by doping P-type dopant on the host. At this time, if the P-charge generating layer 154 is formed of metal, the metal may be at least one selected from a group of Al, Cu, Fe, Pb, Zn, Au, Pt, W, In, Mo, Ni and Ti. At this time, if the P-charge generating layer 154 is formed by doping P-type dopant on the host, materials which are conventionally used may be used as the host and the P-type dopant.

In other words, the P-type dopant may be at least one selected from a group of 2,3,5,6-tetrafluore-7,7,8,8-tetracyano-quino-dimethane (F4-TCNQ), a tetracyano-quino-dimethane derivative, iodine, FeCl3, FeF3 and SbCl5.

In other words, the host is an organic material, and may be at least one selected from a group of N,N'-di(naphtalene-1-yl)-N,N-diphenyl-benzidine (NPB), N,N-diphenyl-N,N-bis(3-methylphenyl)-1,1-biphenyl-4,4'-diamine (TPD) and N,N',N'-tetranaphthyl-benzidine (TNB).

In the present invention, although the first, second and third unit organic layers 182R, 182G, 182B, 184R, 184G, and 184B include the hole transporting layer 120, 122, the first, second and third light emitting layers 132R, 132G, 132B, 134R, 134G, and 134B, and the electron transporting layer 142, 144, at least one of them may be omitted, and a hole injection layer, an electron injection layer or an electron movement stopper layer may be additionally provided.

Finally, the capping layer 170 may be formed on the entire surface of the substrate above the second substrate 160. The capping layer 170 serves to increase optical extraction effect while protecting the second electrode 160, and may include at least one selected from the material included in the hole transporting layer 120, 122, the material included in the electron transporting layer 142, 144, and the material included in the first, second and third light emitting layers 132R, 132G, 132B, 134R, 134G, and 134B. However, the spirits of the present invention are not limited to the above example.

Accordingly, in the organic light emitting display device 100 according to one embodiment of the present invention, if a predetermined voltage is applied to the first electrode 110 and the second electrode 160 in accordance with a color signal which is selected, the holes and the electrons are transported to the first, second and third light emitting layers 132R, 132G, 132B, 134R, 134G, and 134B to generate exciton. When the exciton is transited from the excited state to the ground state, light is generated, whereby the light is emitted in the form of visible ray. At this time, the emitted light passes through the transparent second electrode 160 and then is emitted outside, whereby a random picture image is obtained.

Meanwhile, an encapsulation process should be performed to protect the organic light emitting display device 100 from the outside. In this case, a general thin film encapsulation method may be used. Since the thin film encapsulation method is previously known, its detailed description will be omitted in this specification.

Hereinafter, characteristic evaluation of the organic light emitting display device according to one embodiment of the present invention will be described.

Figure 3:
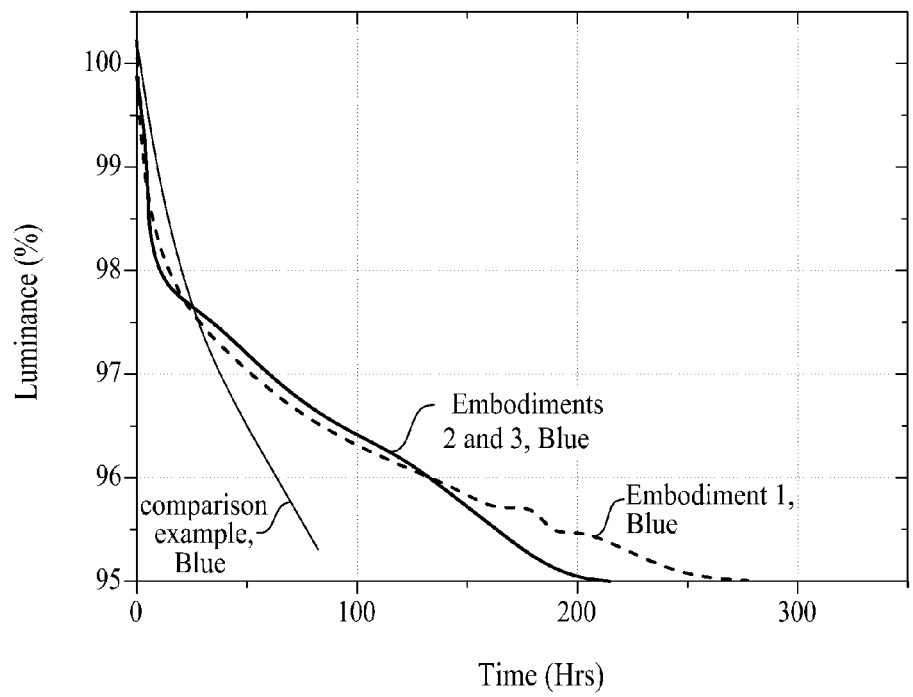
FIGS. 3 to 5 are views illustrating lifespan characteristics based on luminance of an organic light emitting display device manufactured by a comparison example and embodiments 1, 2 and 3.
Figure 4:
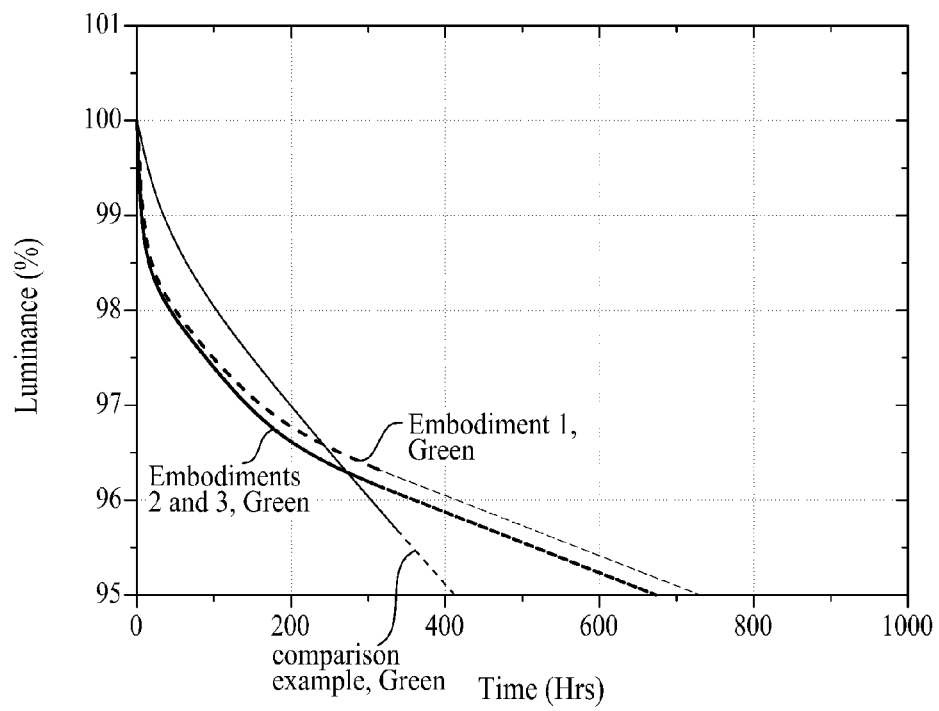
Figure 5:
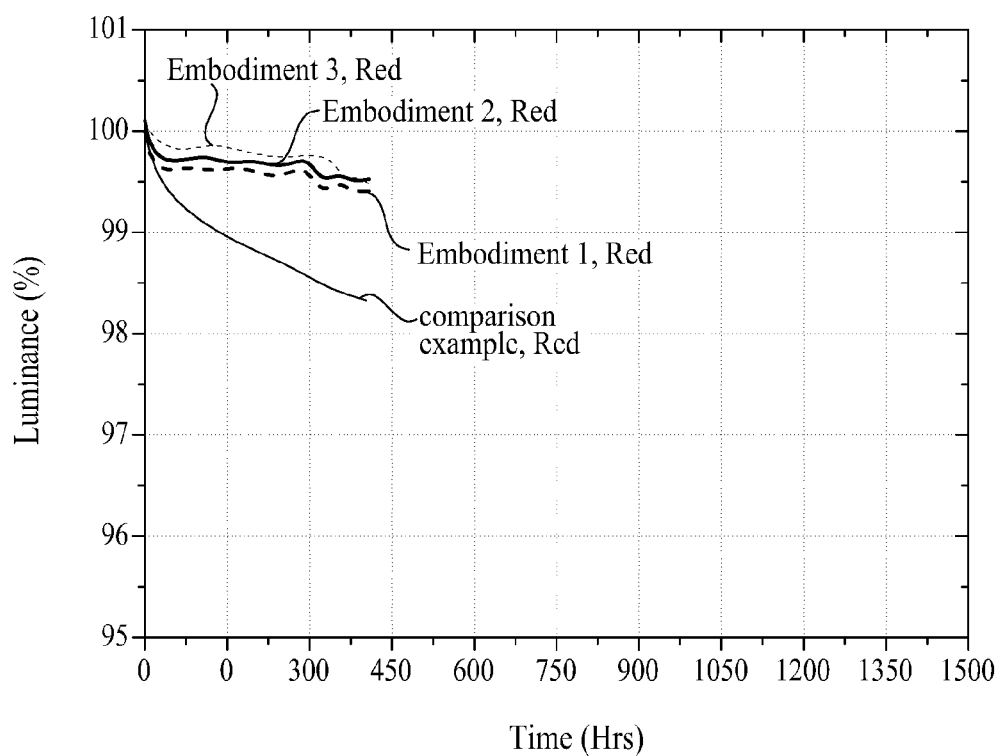

First of all, Table 1 to Table 3 illustrate the result of optical simulation evaluation performed for the organic light emitting display device 10 according to FIG. 1 as a comparison example and three types of organic light emitting display devices 100 according to FIG. 2 as embodiments. Also, FIGS. 3 to 5 illustrate lifespan characteristics based on luminance of the organic light emitting display device actually manufactured by the comparison example and the embodiments 1, 2 and 3. In this case, the organic light emitting display device was measured under a 3.2 inch Full HD condition at a temperature of 70° C. for 250 hours. At this time, the organic light emitting display device 10 according to FIG. 1 as the comparison example and the three types of organic light emitting display devices 100 according to FIG. 2 as the embodiments were manufactured and experimented as follows.

Comparison Example

The first electrode (ITO 70 Å/APC 100 Å/ITO 70 Å) was formed on the substrate. At this time, the first electrode has pixel regions of red, green and blue, wherein each pixel region was identified from another pixel region by a bank layer (not shown). NPD (1100 Å) was formed on the entire surface of the first electrode. At this time, P-type dopant $TCNQF_4$ of 3% by weight was doped on an NPD region (100 Å) of the NPD (1100 Å), which is adjacent to the first electrode. Afterwards, TPD (200 Å) was formed at the pixel region of green and NPD (900 Å) was formed at the pixel region of red, and then TPD (100 Å) was formed on the entire surface. Again, a Pyren derivative of 5% by weight was doped on an Anthracene derivative (200 Å) at the blue pixel region as a blue dopant, and ppy2Ir (acac) of 5% by weight was doped on a 1:1 mixture (400 Å) of CBP and the Anthracene derivative at the green pixel region as a green dopant. Also, btp2Ir(acac) of 5% by weight was doped on Be complex derivative (360 Å) at the red pixel region as a red dopant. Next, $Alq_3$ (350 Å) was formed on the entire surface, and Mg:LiF (1:1, 30 Å) Ag:Mg (3:1, 160 Å) was formed, and then NPD (650 Å) was formed thereon as a capping layer.

Embodiment 1

The first electrode (ITO 70 Å/APC 100 Å/ITO 70 Å) was formed on the substrate. At this time, the first electrode has pixel regions of red, green and blue, wherein each pixel region was identified from another pixel region by a bank layer (not shown).

NPD (375 Å) was formed on the entire surface of the first electrode. At this time, P-type dopant $TCNQF_4$ of 3% by weight was doped on an NPD region (75 Å) adjacent to the first electrode. Afterwards, a Pyren derivative of 5% by weight was doped on an Anthracene derivative (200 Å) at the blue pixel region as a blue dopant, and $ppy_2Ir$ (acac) of 5% by weight was doped on a 1:1 mixture (370 Å) of CBP and the Anthracene derivative at the green pixel region as a green dopant. Also, $btp_2Ir(acac)$ of 5% by weight was doped on Be complex derivative (680 Å) at the red pixel region as a red dopant. Next, $Alq_3$ (250 Å) was formed on the entire surface. Afterwards, Li of 2% by weight was doped on the Anthracene derivative (100 Å). Afterwards, NPD (375 Å) was formed on the entire surface. At this time, P-type dopant TCNQF4 of 12% by weight was doped on NPD region (75 Å) adjacent to a portion where Li of 2% by weight is doped on the Anthracene derivative (100 Å). Afterwards, a Pyren derivative of 5% by weight was doped on the Anthracene derivative (200 Å) at the blue pixel region as a blue dopant, $ppy_2Ir$ (acac) of 5% by weight was doped on a 1:1 mixture (370 Å) of CBP and the Anthracene derivative at the green pixel region as a green dopant, and $btp_2Ir(acac)$ of 5% by weight was doped on Be complex derivative (680 Å) at the red pixel region as a red dopant. Next, a 1:1 mixture (350 Å) of $Alq_3$ and LiQ was formed on the entire surface, and Mg:LiF (1:1, 30 Å)/Ag:Mg (3:1, 160 Å) was formed on the entire surface, and then NPD (650 Å) was formed thereon as a capping layer.

Embodiment 2

The first electrode (ITO 70 Å/APC 100 Å/ITO 70 Å) was formed on the substrate. At this time, the first electrode has pixel regions of red, green and blue, wherein each pixel region was identified from another pixel region by a bank layer (not shown).

HATCN (100 Å) was formed on the entire surface of the first electrode, and NPD (375 Å) was formed thereon. Next, a Pyren derivative of 5% by weight was doped on an Anthracene derivative (200 Å) at the blue pixel region as a blue dopant, ppy$_2$Ir (acac) of 5% by weight was doped on the Anthracene derivative (400 Å) at the green pixel region as a green dopant, and btp$_2$Ir(acac) of 5% by weight was doped on Be complex derivative (700 Å) at the red pixel region as a red dopant. Next, Alg$_3$ (250 Å) was formed on the entire surface, and Li of 2% by weight was doped on the Anthracene derivative (100 Å). Next, HATCN (100 Å) was formed on the entire surface, and NPD (375 Å) was formed thereon. Afterwards, a Pyren derivative of 5% by weight was doped on the Anthracene derivative (200 Å) at the blue pixel region as a blue dopant, ppy$_2$Ir (acac) of 5% by weight was doped on the Anthracene derivative (400 Å) at the green pixel region as a green dopant, and btp$_2$Ir(acac) of 5% by weight was doped on Be complex derivative (700 Å) at the red pixel region as a red dopant. Next, a 1:1 mixture (350 Å) of Alg$_3$ and LiQ was formed on the entire surface, and Mg:LiF (1:1, 15 Å)/Ag:Mg (1:1, 350 Å) was formed on the entire surface, and then NPD (650 Å) was formed thereon as a capping layer.

Embodiment 3

The first electrode (ITO 70 Å/APC 100 Å/ITO 70 Å) was formed on the substrate. At this time, the first electrode has pixel regions of red, green and blue, wherein each pixel region was identified from another pixel region by a bank layer (not shown).

HATCN (100 Å) was formed on the entire surface of the first electrode, and NPD (375 Å) was formed thereon. Next, a Pyren derivative of 5% by weight was doped on an Anthracene derivative (200 Å) at the blue pixel region as a blue dopant, ppy$_2$Ir (acac) of 5% by weight was doped on the Anthracene derivative (400 Å) at the green pixel region as a green dopant, and btp$_2$Ir(acac) of 5% by weight was doped on Be complex derivative (700 Å) at the red pixel region as a red dopant. Next, Alg$_3$ (250 Å) was formed on the entire surface, and Li of 2% by weight was doped on the Anthracene derivative (100 Å). Next, HATCN (100 Å) was formed on the entire surface, and NPD (375 Å) was formed thereon. Afterwards, a Pyren derivative of 5% by weight was doped on the Anthracene derivative (200 Å) at the blue pixel region as a blue dopant, ppy$_2$Ir (acac) of 5% by weight was doped on the Anthracene derivative (400 Å) at the green pixel region as a green dopant, and btp$_2$Ir(acac) of 5% by weight was doped on a 1:1 mixture (700 Å) of Be complex derivative and NPD at the red pixel region as a red dopant. Next, a 1:1 mixture (350 Å) of Alg$_3$ and LiQ was formed on the entire surface, and Mg:LiF (1:1, 15 Å)/Ag:Mg (1:1, 160 Å) was formed on the entire surface, and then NPD (650 Å) was formed thereon as a capping layer.

TABLE 1

| | | | Blue (B) pixel region | | | |
|---|---|---|---|---|---|---|
| | Driving voltage (V) | Current efficiency (cd/A) | Power efficiency (lm/W) | Color coordinate (CIE_x) | Color coordinate (CIE_y) | External quantum efficiency (EQE, %) |
| Comparison example | 4.0 | 4.9 | 3.8 | 0.144 | 0.041 | 12.3 |
| Embodiment 1 | 7.2 | 7.8 | 3.3 | 0.143 | 0.046 | 17.8 |
| Embodiment 2 | 7.2 | 7.8 | 3.3 | 0.143 | 0.046 | 17.8 |
| Embodiment 3 | 7.2 | 7.8 | 3.3 | 0.143 | 0.046 | 17.8 |

TABLE 2

| | | | Green (G) pixel region | | | |
|---|---|---|---|---|---|---|
| | Driving voltage (V) | Current efficiency (cd/A) | Power efficiency (lm/W) | Color coordinate (CIE_x) | Color coordinate (CIE_y) | External quantum efficiency (EQE, %) |
| Comparison example | 3.9 | 114.2 | 91.8 | 0.205 | 0.732 | 31.9 |
| Embodiment 1 | 7 | 169.9 | 77.9 | 0.203 | 0.725 | 49.3 |
| Embodiment 2 | 7 | 160.8 | 78 | 0.180 | 0.730 | 49 |
| Embodiment 3 | 7 | 160.8 | 78 | 0.180 | 0.730 | 49 |

TABLE 3

| | Red (R) pixel region | | | | | |
|---|---|---|---|---|---|---|
| | Driving voltage (V) | Current efficiency (cd/A) | Power efficiency (lm/W) | Color coordinate (CIE_x) | Color coordinate (CIE_y) | External quantum efficiency (EQE, %) |
| Comparison example | 3.8 | 58.8 | 44.2 | 0.663 | 0.334 | 38.9 |
| Embodiment 1 | 9 | 111.2 | 38.9 | 0.650 | 0.347 | 62.9 |
| Embodiment 2 | 9.5 | 80.0 | 37.0 | 0.673 | 0.323 | 62 |
| Embodiment 3 | 6.9 | 80.2 | 38.8 | 0.669 | 0.332 | 56 |

As shown in Table 1 to Table 3 and FIGS. 3 to 5, at the blue (B) pixel region according to the embodiments 1 and 2 as compared with the comparison example, it is noted that current efficiency was increased as much as 50%, approximately, and lifespan was increased as much as 180%, approximately.

Also, at the green (G) pixel region according to the embodiment 1 as compared with the comparison example, it is noted that current efficiency was increased as much as 50%, approximately, and lifespan was increased as much as 75%, approximately. At the green (G) pixel region according to the embodiment 2 as compared with the comparison example, it is noted that current efficiency was increased as much as 40%, approximately, and lifespan was increased as much as 65%, approximately.

Also, at the red (R) pixel region according to the embodiment 1 as compared with the comparison example, it is noted that current efficiency was increased as much as 90%, approximately, and lifespan was increased as much as 150%, approximately. At the red (R) pixel region according to the embodiments 2 and 3 as compared with the comparison example, it is noted that current efficiency was increased as much as 65%, approximately, and lifespan was increased as much as 40%, approximately. Also, at the red (R) pixel region according to the embodiment 3 as compared with the embodiments 1 and 2, it is noted that lifespan is equivalent to that of the embodiments 1 and 2 and a driving voltage was lowered to 2.1 V and 2.6V, respectively.

As described above, in the structure that the light emitting layer is deposited two times as compared with the structure that the light emitting layer is deposited once, current efficiency and lifespan characteristics of the organic light emitting display device may be improved, and if the host included in the light emitting layer includes two materials or more, in more detail, if the material used for the hole transporting layer is mixed with the host included in the light emitting layer, it is advantageous in that the driving voltage may be reduced.

For example, if the 1:1 mixture of the Be complex derivative and NPD is used as the host, the problem that the driving voltage is increased as the organic layer becomes thick may be solved, whereby power consumption may be lowered. In addition, instead of NPD, the triamine derivative may be used for the 1:1 mixture.

In the organic light emitting display device according to one embodiment of the present invention, as the light emitting layer is additionally provided, it is noted that current efficiency is improved and lifespan is increased. Moreover, the material used for the hole transporting layer is mixed with the host included in the light emitting layer, whereby the increase width of energy barrier is lowered as the light emitting layer becomes thick, and transportation of holes to the light emitting layer is easily performed. As a result, lifespan is maintained at an equivalent level to the case where the material used for the hole transporting layer is not mixed with the host included in the light emitting layer, and at the same time the driving voltage is lowered, whereby power consumption is lowered.

According to the present invention, the following advantages may be obtained.

Lifespan and current efficiency characteristics may be improved while high luminance characteristic is maintained. The organic light emitting display device of which reliability is excellent at high temperature may be provided. Accordingly, the product of high resolution, which may solve structural limitation of the general organic light emitting display device, may be realized.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. An organic light emitting display device comprising:
a substrate including a first pixel region, a second pixel region, and a third pixel region;
a first electrode on the substrate;
a second electrode on the first electrode; and
an organic layer between the first electrode and the second electrode,
wherein the organic layer includes a first organic layer in the first pixel region, a second organic layer in the second pixel region, and a third organic layer in the third pixel region, such that the first, second and third organic layers are arranged to correspond with the first, second and third pixel regions, respectively,
wherein the first organic layer includes a plurality of first unit organic layers, and a charge generating layer between the plurality of first unit organic layers,
wherein the second organic layer includes a plurality of second unit organic layers, and a charge generating layer between the plurality of second unit organic layers,
wherein the third organic layer includes a plurality of third unit organic layers, and a charge generating layer between the plurality of third unit organic layers,
wherein each of the first unit organic layers includes a hole transporting layer, a first light emitting layer, and an electron transporting layer,
wherein each of the second unit organic layers includes a hole transporting layer, a second light emitting layer, and an electron transporting layer, wherein each of the third unit organic layers includes a hole transporting layer, a third light emitting layer, and an electron transporting layer, and wherein the first organic layer emits red light, the second organic layer emits green light, and the third organic layer emits blue light.

2. The organic light emitting display device of claim 1, wherein the first electrode is reflective, and the second electrode allows a portion of incident light to transmit through.

3. The organic light emitting display device of claim 1, wherein the first organic layer has a thickness thicker than that of the second and the third organic layers, and the second organic layer has a thickness thicker than that of the third organic layer.

4. The organic light emitting display device of claim 1, wherein the first unit organic layers have a thickness thicker than that of the second and the third unit organic layers, and the second unit organic layers have a thickness thicker than that of the third unit organic layers.

5. The organic light emitting display device of claim 1, wherein the first light emitting layer has a thickness thicker than that of the second and the third light emitting layers, and the second light emitting layer has a thickness thicker than that of the third light emitting layer.

6. The organic light emitting display device of claim 1, wherein the charge generating layer includes an N-charge generating layer and a P-charge generating layer, the N-charge generating layer includes an N-type dopant, and the P-charge generating layer includes a P-type dopant.

7. The organic light emitting display device of claim 1, wherein the first unit organic layers further includes a hole injection layer and art electron injection layer, the second unit organic layers further includes a hole injection layer and an electron injection layer, and the third unit organic layers further includes a hole injection layer and an electron injection layer.

8. The organic light emitting display device of claim 1, wherein at least one of the plurality of first, the second, and the third light emitting layers includes a host, which includes two materials, and a dopant.

9. The organic light emitting display device of claim 8, wherein the two materials include arylamine derivative.

10. The organic light emitting display device of claim 8, wherein the two materials include a material having hole mobility of a value between $1.0 \times 10^{-5}$ (cm$^2$/Vs) and $1.0 \times 10^{-1}$ (cm$^2$/Vs).

11. The organic light emitting display device of claim 1, wherein one of the plurality of first light emitting layers includes a material having hole mobility of a value between $1.0 \times 10^{-5}$ (cm$^2$/Vs) and $1.0 \times 10^{-1}$ (cm$^2$/Vs).

12. The organic light emitting display device of claim 1, wherein the device does not include a color filter.

* * * * *